United States Patent [19]

Hamazaki et al.

[11] Patent Number: 4,688,088

[45] Date of Patent: Aug. 18, 1987

[54] POSITION DETECTING DEVICE AND METHOD

[75] Inventors: Bunei Hamazaki, Yokohama; Naoki Ayata, Machida, both of Japan

[73] Assignee: Canon Kabushiki Kaisha, Tokyo, Japan

[21] Appl. No.: 723,459

[22] Filed: Apr. 15, 1985

[30] Foreign Application Priority Data

| Apr. 20, 1984 | [JP] | Japan | 59-78633 |
| Apr. 20, 1984 | [JP] | Japan | 59-78634 |
| Apr. 20, 1984 | [JP] | Japan | 59-78635 |

[51] Int. Cl.$^4$ .......................... H04N 7/00; H04N 7/18
[52] U.S. Cl. .................................. 358/101; 358/107; 382/18; 356/401
[58] Field of Search ............... 358/101, 107; 356/400, 356/401; 382/8, 18, 51

[56] References Cited

U.S. PATENT DOCUMENTS

| 3,988,535 | 10/1976 | Hickman et al. | 358/101 |
| 4,253,112 | 2/1981 | Doemens | 358/101 |
| 4,352,125 | 9/1982 | Guth | 358/101 |
| 4,475,122 | 10/1984 | Green | 358/101 |
| 4,550,374 | 10/1985 | Meshman et al. | 358/101 |

*Primary Examiner*—Howard W. Britton
*Assistant Examiner*—John K. Peng
*Attorney, Agent, or Firm*—Fitzpatrick, Cella, Harper & Scinto

[57] ABSTRACT

An improved method and device for detecting a position of a mark formed on an object, by providing plural peaks in an image density distribution, wherein the image of the object having the mark is picked up to provide an image signal which in turn is processed to provide an integrated image-density distribution of the image in a predetermined direction and wherein the position of the mark is detected on the basis of the plural peaks in the integrated image-density distribution.

6 Claims, 18 Drawing Figures

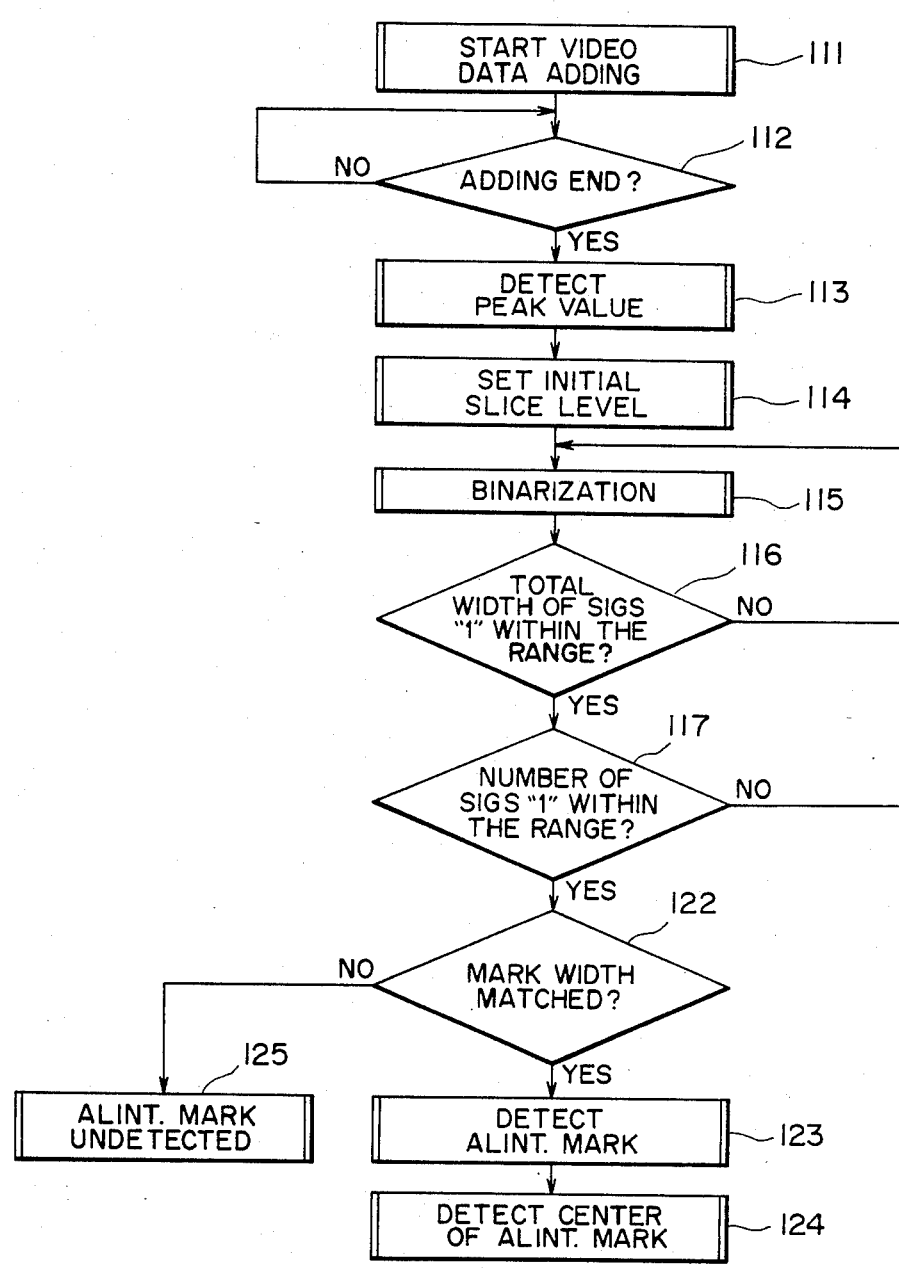
FIG. IIA

POSITION DETECTING DEVICE AND METHOD

BACKGROUND OF THE INVENTION

This invention relates to position detecting device and method for detecting the position of a mark formed on an object and, more particularly, to position detecting device and method for accurately detecting the position of a mark on the basis of image signals obtained by image pickup through image pickup means such as a TV camera or a charge coupled device, upon alignment between a photomask or reticle and a semiconductor wafer prior to exposure processes for the manufacture of semiconductor devices.

In exposure apparatuses for use in the manufacture of semiconductor devices such as integrated circuits, detecting the position of a mark prepared for the purpose of alignment between two objects involves, as is known in the art, viewing the mark through image pickup means and binarizing or binary-coding the output signals produced by the image pickup means.

The output signals of the image pickup means vary in dependence upon the kind or condition of the wafer on which the mark is formed and/or the magnitude of a concavity or convexity defining the mark. Since the degree of variation in the output signal is very high, the binary-coding often fails to meet such variation, so that a pattern other than the alignment mark is detected as if it is the alignment mark in some cases, or the detection itself ends in failure, even if the alignment mark is present in the field of detection.

SUMMARY OF THE INVENTION

It is accordingly a primary object of the present invention to provide an improved device and method by which high-precision detection of the position of a mark is stably assured.

Briefly, according to the present invention, there is provided an improved method and device for detecting a position of a mark formed on an object, providing plural peaks in an image density distribution, wherein the image of the object having the mark is picked up to provide an image signal which in turn is processed to provide an integrated density distribution of the image in a predetermined direction and wherein the position of the mark is detected on the basis of the plural peaks in the integrated image-density distribution.

In accordance with another aspect of the present invention, the integrated image-density distribution as aforesaid is binarized or binary-coded with a given slice level and the widths of the binary-coded signals are added to each other. The resultant or total width is then compared with a predetermined reference value or range and, on the basis of the result of which, an appropriate slice level for the binary-coding is newly set if the initial slice level is not proper, whereby high-accuracy and high-speed detection of the position of the mark is assured.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Figure 1:
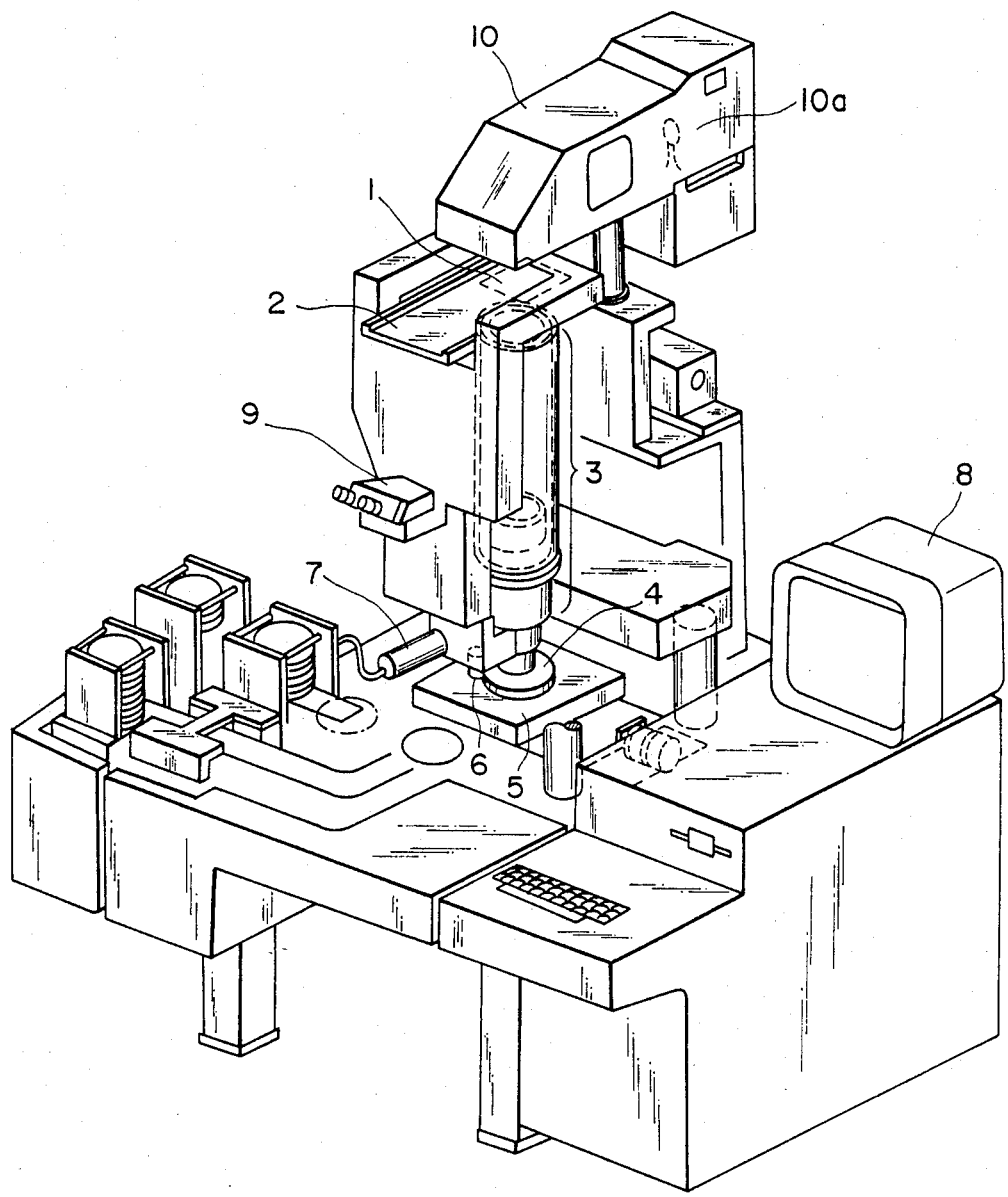
FIG. 1 is a perspective view showing an exposure apparatus into which a position detecting device and method according to an embodiment of the present invention is incorporated.

Referring first to FIG. 1, there is shown an outer general view of an alignment and exposure apparatus, for use in the manufacture of semiconductor devices such as integrated circuits, into which apparatus the position detecting device and method according to an embodiment of the present invention is incorporated.

A photomask or reticle 1 (which will be hereinafter referred to simply as "mask") has formed thereon a pattern for preparing the integrated circuits. The mask 1 also has a mask setting mark and fine alignment marks. A mask chuck 2 holds the mask 1 and is movable in a plane, and in a rotational direction. Disposed under the mask 1 is a reduction projection lens system 3 and a wafer 4 having a sensitive layer. The wafer 4 has formed thereon fine alignment marks to be used during fine alignment through the projection lens system 3 and a prealignment mark to be used during TV prealignment. A wafer stage 5 holds the wafer 4 and is movable in a plane, and in a rotational direction. The stage 5 is also movable between a wafer exposure station within the field of projection and a TV prealignment station. A TV prealignment system includes an objective lens 6, image pickup means 7 such as an image pickup tube or a solid image-pickup device, and a television receiver 8 for observation. A binocular unit 9 is provided to observe the surface of the wafer 4 through the projection lens system 3. An upper unit 10 contains a light source 10a for supplying an illumination light beam for the mask, an illumination optical system for converging the light beam emitted from the light source 10a, and a detection system for the fine alignment.

A wafer stage 5 receives, at a predetermined station, the wafer 4 conveyed thereto by an unshown wafer feeding mechanism and is movable to a position whereat the prealignment mark formed on the wafer 4 is positioned within the view field of the objective lens, 6 of the TV prealignment system. The positioning of the wafer 4 at that time relies upon the mechanical accuracies and the objective lens 6 has a field of view of the order of 1–2 mm in diameter. The prealignment mark positioned within the view field is detected by the image pickup tube 7 and the coordinates of the alignment mark within the TV prealignment view field are detected. Since, on the other hand, both the fine alignment detecting position (automatic alignment detecting position) of the projection optical system and the position of the origin of the TV prealignment view field are predetermined, the amount of movement of the wafer stage 5 to move the wafer 4 to the fine alignment position (automatic alignment position) can be determined on the basis of the two predetermined positions and of the detected co-ordinates of the TV prealignment mark.

The position detecting accuracy of the TV prealignment is of the order of ±5 microns or less and, even if the error which may be caused during the movement of the wafer stage 5 from the TV prealignment position to the fine alignment position is taken into account, the TV prealignment error is of the order of ±10 microns. This allows the fine alignment only within the range of approx. ±10 microns which range is equal to or less than 1/100 of the detection field of the prior art fine alignment system. Accordingly, high-speed fine alignment is attainable.

Figure 2:
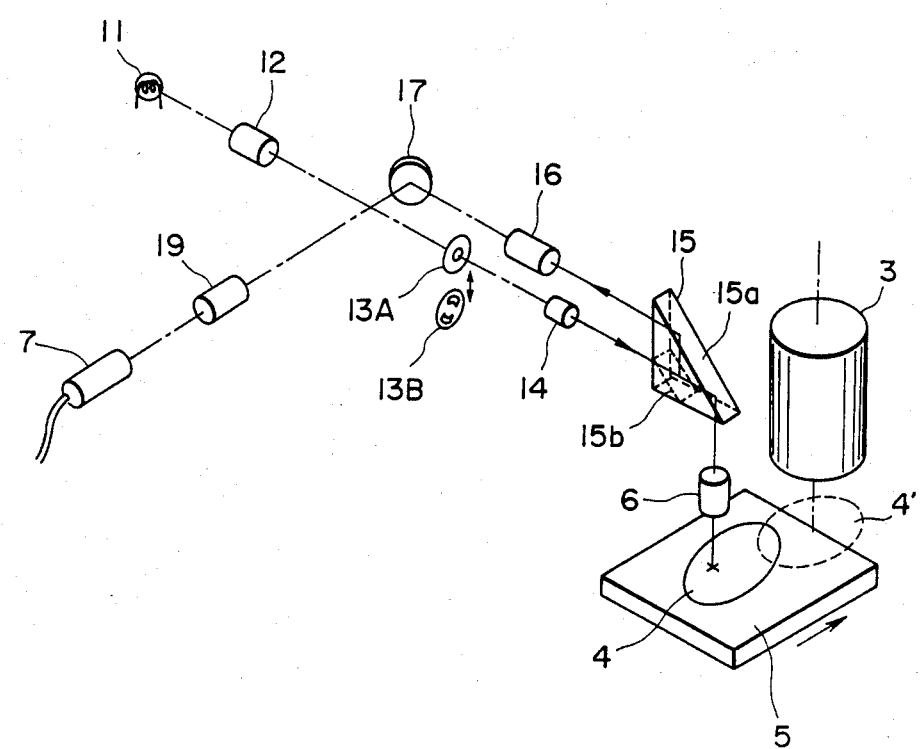
FIG. 2 is a perspective view schematically showing an optical arrangement of a TV prealignment system.

FIG. 2 shows the optical arrangement of the TV prealignment detecting system of the FIG. 1 apparatus, with the same reference numerals being assigned to the same elements, respectively.

In FIG. 2, the TV prealignment detecting system includes an illumination light source 11 such as a halogen lamp, a condenser lens 12 and two interchangeable aperture stops, i.e. a light-field aperture stop 13A and a dark-field aperture stop 13B. In FIG. 2 mode, the light-field aperture stop 13A is introduced into the optical path, so that the condenser lens 12 forms an image of the light source 11 on the light-field aperture stop 13A. The system further includes an illumination relay lens 14 and a cemented prism 15 having an internal reflecting surface 15a and a semi-transmitting reflection surface 15b. As will be described later, the cemented prism 15 functions to combine the optical axis of an illumination system with the optical axis of a light receiving system. The illumination system comprises the light source 11, condenser lens 12, aperture stops 13A and 13B, illumination relay lens 14, cemented prism 15 and objective lens 6. The light beam emerging from the objective lens 6 is perpendicularly incident on the wafer 4 to illuminate the surface thereof.

The system further includes a relay lens 16, a mirror 17 for bending the optical path and an image pickup lens 19. The cemented prism 15, relay lens 16, mirror 17, image pickup lens 19 as well as the image pickup tube 7 constitute the above-described light receiving system. The light beam coming back from the wafer 4 surface and passing through the objective lens 6 is reflected by the internal reflection surface 15a of the cemented prism 15, is reflected by the semi-transmitting reflection surface 15b and again reflected by the internal reflection surface 15a toward the relay lens 16. Whereby, the image of the prealignment mark of the wafer 4 is formed on the image pickup surface of the image pickup tube 7.

Description will now be given to the detection of the prealignment mark. However, the electric processing of video signals produced by the detection will be described later.

The light beam emerging from the illumination light source 11, after it is converged by the condenser lens 12, illuminates the aperture of the light-field aperture stop 13A or the dark-field aperture stop 13B. The light beam passing through the aperture passes through the illumination relay lens 14 and is incident on the cemented prism 15. The light beam incident on the cemented prism 15 is transmitted through the semi-transmitting reflection surface 15b of the cemented prism and is then reflected by the reflection surface 15a toward the objective lens 6. Then, the light beam is transmitted through the objective lens 6 to illuminate the wafer 4 surface.

The light beam reflected by the wafer 4 surface enters again into the objective lens 6 and, after it is imaged by this objective lens 6, enters again the cemented prism 15. The incident light beam is reflected by the internal reflection surface 15a, reflected by the semi-transmitting reflection surface 15b and again reflected by the reflection surface 15a, so that it emerges therefrom toward the relay lens 16. The light beam passing through the relay lens 16 is directed to the mirror 17 so that it is reflected toward the image pickup lens 19 by which it is imaged on the image pickup tube 7.

Subsequently, the light-field aperture stop 13A is replaced by the dark-field aperture stop 13B to establish the dark-field detection mode, so that the image of the prealignment mark appears clearly on the image pickup surface on the image pickup tube 7. The image is picked up by the image pickup tube 7 and the position of the prealignment mark is detected by electrically processing video signals in the manner as will be described later. In accordance with the position of the prealignment mark thus detected, the wafer stage 5 moves until the wafer 4 is located at a predetermined position 4' within the projection field of the projection lens system 3. It is a possible alternative to first place the wafer 4 at a position in alignment with a reference position of the TV pre-alignment station and thereafter to move the wafer 4 until it is positioned within the projection field of the projection lens system 3.

Figure 3:
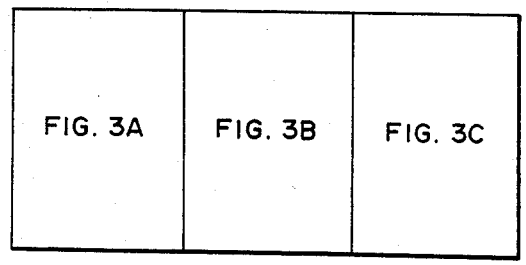
FIGS. 3–3C are block diagrams showing an example of a detecting circuit in the TV prealignment system of FIGS. 1 and 2.
Figure 3C:
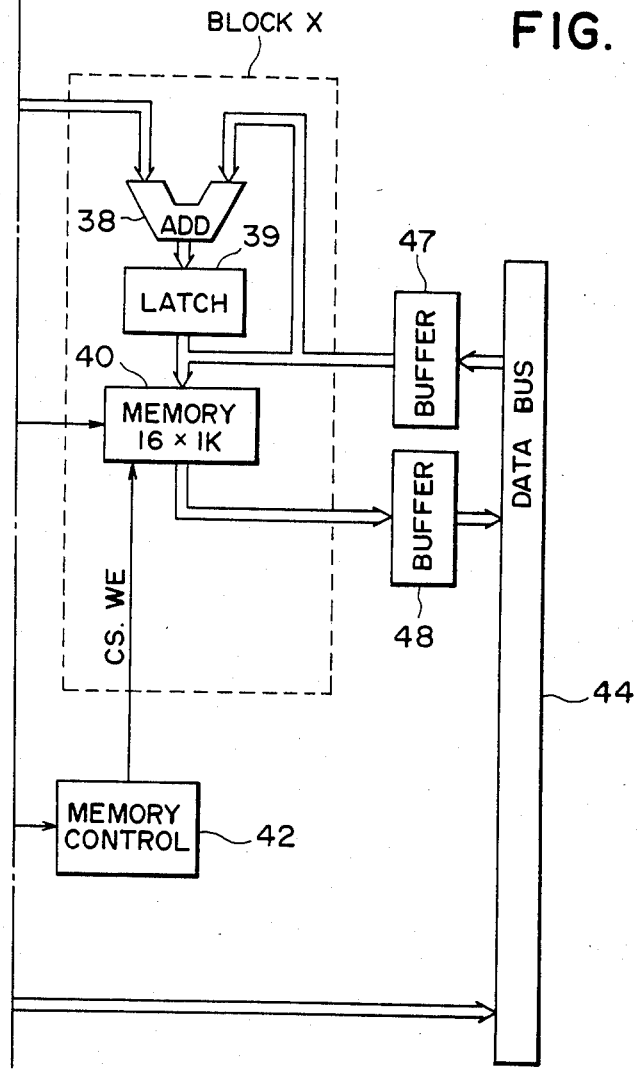
Figure 3A:
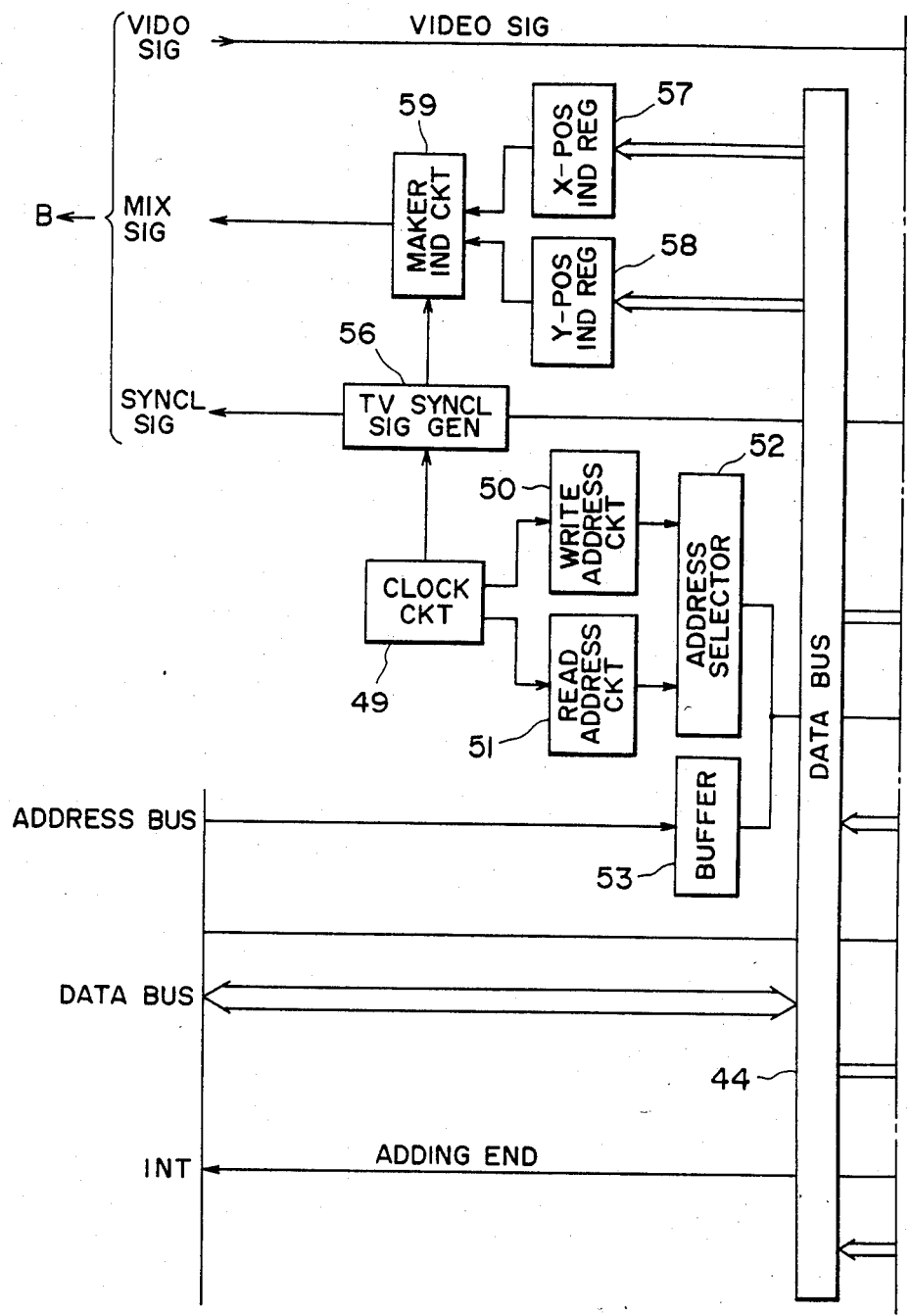
Figure 3B:
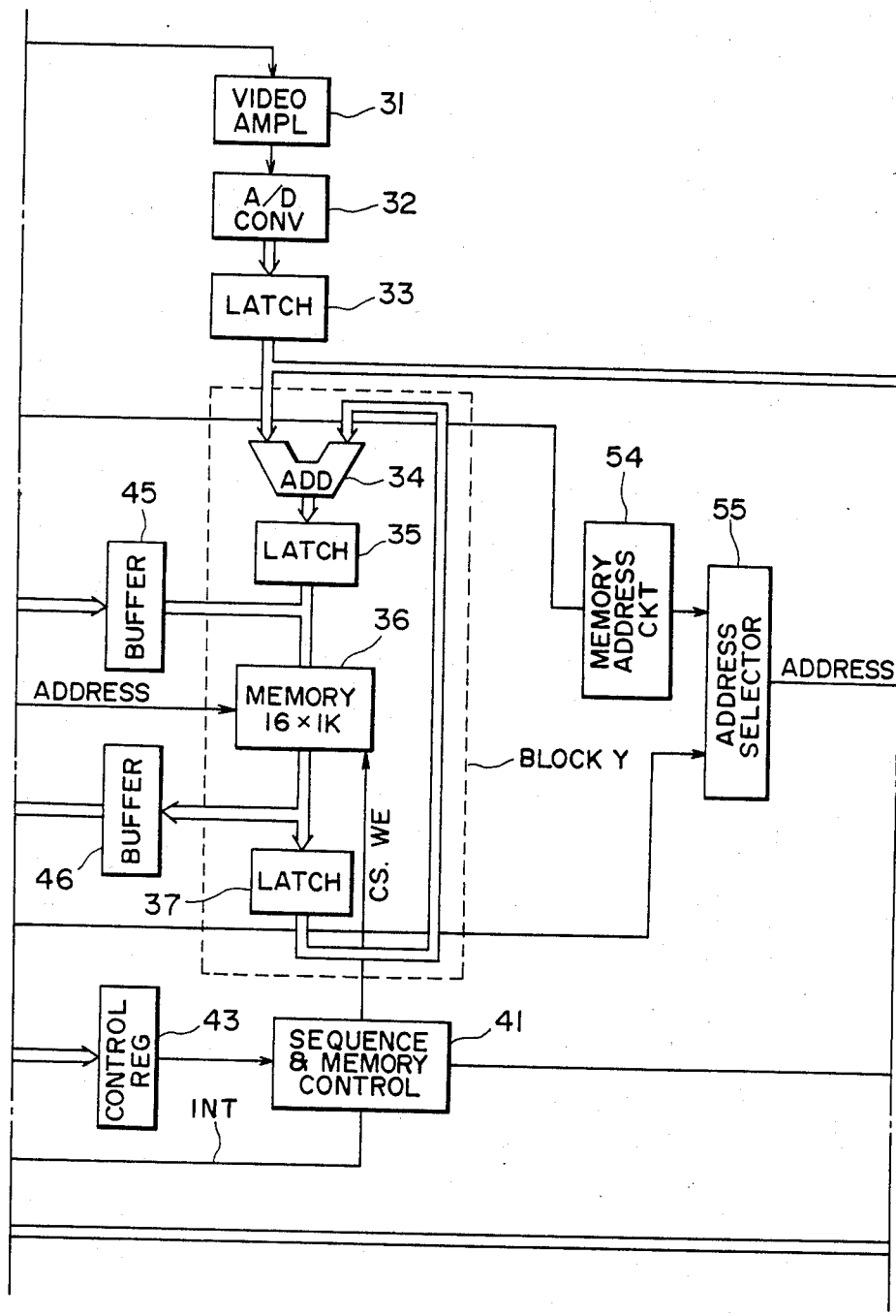

Referring now to FIG. 3, there is shown an example of an electric circuit for the TV prealignment detection system.

Figure 5:
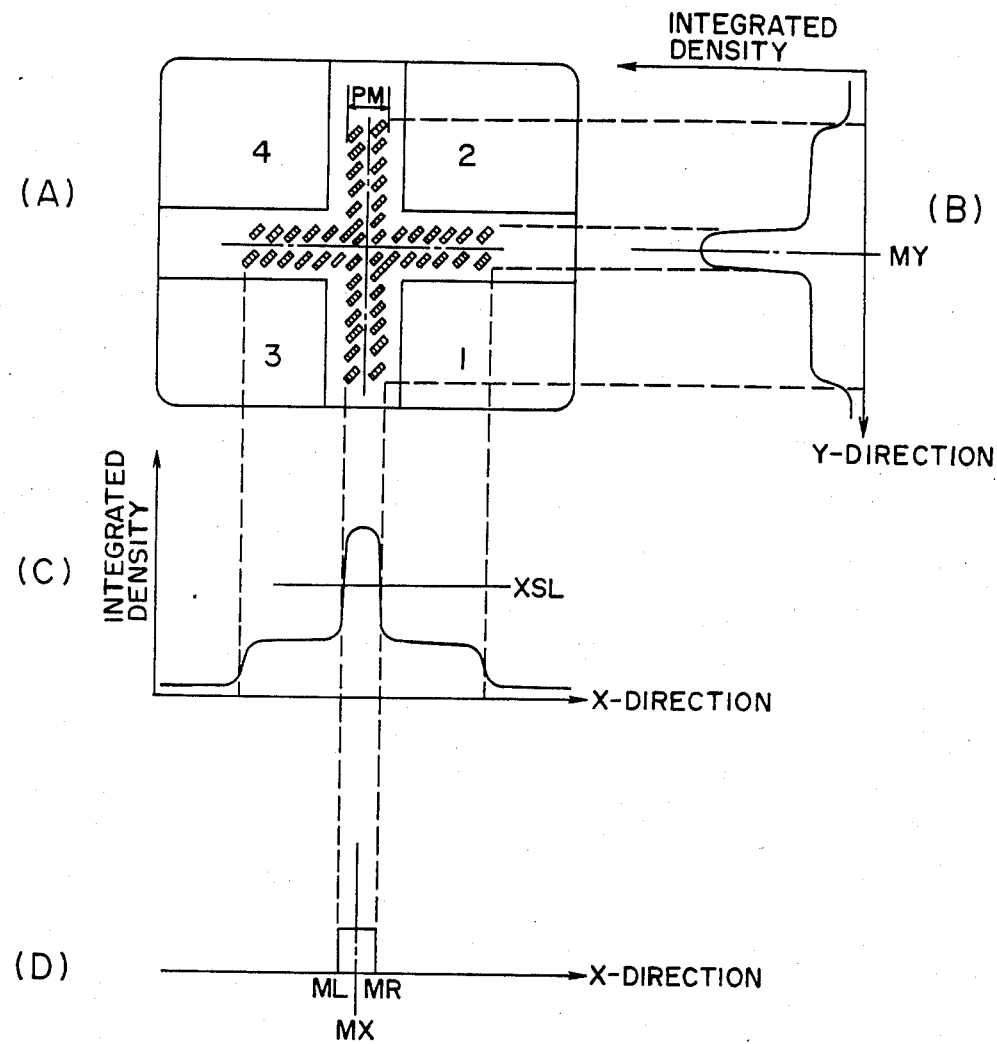
FIG. 5 shows image pickup relative to a TV prealignment mark and shows signal processing with reference to image density.

While there have been proposed a variety of electrical processing techniques for the detection of the TV prealignment mark, such as shown in FIG. 5 as an example, the system shown in FIG. 3 is arranged to divide, into plural picture elements (discrete areas), the picture image on the television and to add up or integrate the densities of the picture elements with respect to each of two orthogonal directions, i.e. X-direction (horizontal) and Y-direction (vertical). Adding or integrating the densities of the picture elements provides the following advantages:

(1) Random noises are avaraged so that the signal-to-noise ratio is improved.

(2) The position detection in X-direction and the position detection in Y-direction can be effected independently from each other, so that the detection is facilitated.

(3) Smaller memory capacity is necessary for storing image data or information.

In the block diagram of FIG. 3, a block X (broken line) shows a portion of the system which is effective to add up the densities of the picture elements in the X-direction, while a block Y (broken line) shows another portion of the system which is effective to add up the densities of the picture elements in the Y-direction.

As is shown in FIG. 3, the system further includes a video amplifier 31, and analog-to-digital converter 32 and a latch 33. A video signal supplied from a TV camera control unit (designated at B in FIG. 3) is amplified by the video amplifier 31 and the amplified video signal is converted by the analog-to-digital converter 32 into a digital signal. The digital signal is then stored in the latch 33. An output data of the latch 33 is supplied to each of the X-direction adding block X and the Y-direction adding block Y.

The block Y comprises an adder 34 for adding up or integrating the data in the Y-direction, an adding output latch 35 for latching an output data of the adder 34, a Y-direction integration memory 36 for storing therein the data supplied from the adding output latch 35, and an adding input latch 37 for latching an output data from the memory 36.

The block X comprises an adder 38 for adding up or integrating the data in the X-direction, a latch 39 for latching an output of the adder 38, and an X-direction integration memory 40 for storing therein the output data from the latch 39.

The bit number of the digital data for the above-described system is not limited to a particular one and, in the disclosed example, the analog-to-digital converter 32 is of 8-bit type while each of the adders 34, 38 and memories 36, 40 is of 16-bit type.

The system further includes a sequence and memory control circuit 41 for controlling the timing and sequence of the TV prealignment detecting circuit and for controlling chip selection and read/write of the memory 36, and a memory control circuit 42 for controlling the memory 40 in the block X. A control register 43 is provided to allow a microprocessor (not shown) to control the sequence-and-memory control circuit 41. An input to the control register 43 is supplied by a data bus 44 of the microprocessor. Also, the microprocessor is able to access through this data bus 44 to the memories 36 and 40. For this purpose, buffers 45, 46, 47 and 48 are provided. Among them, each of the buffers 45 and 47 is operative when the microprocessor operates to write the data in the memory 36 or 40, while each of the buffers 46 and 48 is operative when the data is to be read. The system further includes a clock circuit 49, a memory write address circuit 50 and a memory read address circuit 51 for producing, respectively, a write address and a read address for the X-direction integration memory 36. An address selector 52 is effective to interchange the read address and the write address for the memory. An address buffer 53 is provided which is operative when the microprocessor accesses the memory 36. When the microprocessor does not access, the output of the address selector 52 is selected while the output of the buffer 53 is inhibited. A memory address circuit 54 produces an address for the X-direction integration memory 40, and an address selector 55 operates to inerchange the address from the memory address circuit 54 and the address to be produced when the microcomputer accesses the memory 40.

A TV synchronizing signal generating circuit 56 is provided to generate, using the clock from the clock circuit 49 as the reference, a horizontal synchronizing signal, a vertical sysnchronizing signal, a blanking signal or the like for the television system. An X-position indicating register 57 and a Y-position indicating register 58 are provided each of which is connected to the data bus 44 of the microcomputer. Aslo these registers 57 and 58 are connected to a marker indicating circuit 59. Thus, when the microprocessor supplies output information about the position of the alignment mark, as detected by the TV prealignment, to each of the X-position indicating register 57 and the Y-position indicating register 58, the marker indicating circuit 59 produces a mixed signal which is applied to a video input terminal of the TV camera control unit.

The details of the function and operation of the TV prealignment detecting circuit of FIG. 3 will now be described.

The TV prealignment detecting circuit has functions of (1) integration of the data in the X-direction, (2) integration of the data in the Y-direction and (3) indication or display, in the TV monitor, of the detected position of the prealignment mark. As regards the integration of the data in the X-direction and in the Y-direction, of the above-described functions, the adding operation is carried out by the hardware of the TV prealignment detecting circuit and the data resulting from the adding operation is stored in the memory. The adding operation is carried out relative to the TV signals for each one frame. As will be described later, the adding operation may be effected relative to only one frame or relative to each of plural frames, if necessary. In any case, during the adding operation, the data bus and the address bus for the memories 36 and 40 are electrically isolated from the data bus 44 and the address bus of the microprocessor. The address of the memory 36 is connected to that of the address selector 52 while the address of the memory 40 is connected to that of the address selector 55. Thus, the adding operation is carried out under the control by the read/write signal and the chip selection signal produced by the sequence and memory control circuit 41 and the memory control circuit 42 as the hardware of the system.

Upon completion of the adding operation relative to the frame or frames of the predetermined number, the sequence and memory control circuit 41 produces an adding end signal which is supplied along an interruption signal line INT. After generation of the adding end signal, the microprocessor accesses the memories 36 and 40 to detect the position of the TV prealignment mark on the basis of the results of the adding operation. When the microprocessor accesses the memories 36 and 40, the address, read/write signal, chip selection signal or the like for each memory are of course controlled by a control signal supplied from the microcomputer. The data of the memory 36 is supplied via the buffer 46, while the data of the memory 40 is supplied via the buffer 48, both to the data bus 44 whereby they are read by the microprocessor.

Figure 4:
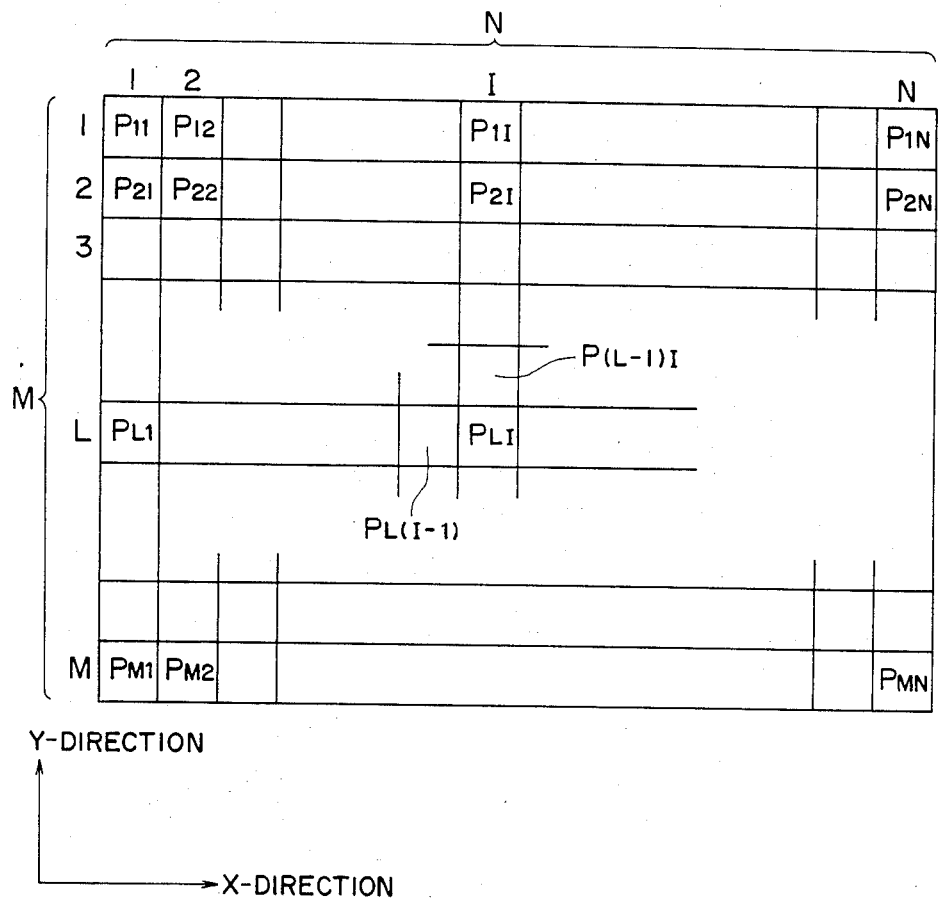
FIG. 4 shows an example of division, into picture elements, of a picture plane or field of a television.

Before describing the adding operation with respect to the X-direction by the block X of FIG. 3 and the adding operation with respect to the Y-direction by the block Y of the same Figure, division of the picture plane into plural picture elements will now be described with reference to FIG. 4. In FIG. 4, there are shown the plural picture elements which are defined by dividing the TV picture plane into N (an integral number) with respect to the X-direction and into M (an integral number) with respect to the Y-direction. A reference character $P_{LI}$ denotes a picture element located on row or line L on column I. The dividing number M in the Y-direction is usually equal to the number of horizontal scanning lines. Accordingly, division into picture elements $M \times N$ can be achieved by effecting N-times sampling operations at the analog-to-digital converter 32 in FIG. 3 within the duration of one horizontal synchronizing signal.

Therefore, the adding operation with respect to the X-direction is expressed as follows:

$$S_{X1} = \text{Data}(P_{11}) + \text{Data}(P_{12}) + \ldots + \text{Data}(P_{1N})$$

$$S_{X2} = \text{Data}(P_{21}) + \text{Data}(P_{22}) + \ldots + \text{Data}(P_{2N})$$

$$S_{XM} = \text{Data}(P_{M1}) + \text{Data}(P_{M2}) + \ldots + \text{Data}(P_{MN})$$

The adding operation with respect to the Y-direction is expressed as follows:

$$S_{Y1} = \text{Data}(P_{11}) + \text{Data}(P_{21}) + \ldots + \text{Data}(P_{M1})$$

$$S_{Y2} = \text{Data}(P_{12}) + \text{Data}(P_{22}) + \ldots + \text{Data}(P_{M2})$$

$$S_{YN} = \text{Data}(P_{1N}) + \text{Data}(P_{2N}) + \ldots + \text{Data}(P_{MN})$$

At the time at which the adding opertion is completed, the X-direction integration memory 40 has stored therein the data of $S_{X1}, S_{X2} \ldots S_{XM}$ while the Y-direction integration memory 36 has stored therein the data of $S_{Y1}, S_{Y2} \ldots S_{YN}$.

Now, detection of the position of the alignment mark in accordance with an embodiment of the present invention will be described. Briefly, according to the present invention, whether or not an obtained signal actually corresponds to the alignment mark is discriminated on the basis of the discrimination of the width of the signal.

For a better understanding of the present invention, prior art detecting technique will first be described. An example of a known type TV prealignment mark is illustrated in the upper part A of FIG. 5. The TV prealignment mark is formed within a scribe line on the wafer or formed on the wafer at a position in a region in which a particular chip pattern is to be formed. In the illustrated example, the alignment mark is formed within the scribe line. The alignment mark has the shape of a cross so that it includes a portion which is to be disposed in parallel to the scanning direction of the image pickup tube and another portion which is to be disposed perpendicularly to the scanning direction. Particularly, the illustrated example of the alignment mark comprises an aggregation of small bar-like protrudent elements each of which is inclined by an angle of 45 degrees relative to the scanning direction. Such arrangement is effective in the point that, when the illumination beam is incident perpendicularly to these protrudent elements, i.e. perpendicularly to the surface of the alignment mark, a distinct or sharp image of the pattern of the alignment mark can be picked up. The integrated densities of such TV prealignment mark with respect to the X-direction and Y-direction have such distributions as shown in the parts B and C of FIG. 5.

The part B of FIG. 5 shows the distribution, in the Y-direction, of the densities as integrated with respect to the X-direction, while the part C of FIG. 5 shows the distribution, in the X-direction, of the densities as integrated with respect to the Y-direction. It is seen from FIG. 5 that, when, for example, a suitable slice level XSL is determined in the part C of FIG. 5 to binary-code the integrated density, a binary-coded pattern having a rectangular pulse of a width MR-ML as shown in the part D of FIG. 5 is obtained. The center MX of the pulse of the binary-coded pattern is given by $MX=(MR-ML)/2$.

In the similar manner, binarization with respect to the Y-direction is effected whereby the center MY of a rectangular pulse of a binary-coded pattern is detected. The thus detected two values show the co-ordinates of the center of the prealignment mark. As for the determination of the slice level, the microprocessor accesses the contents of the memories 36 and 40 in FIG. 3 so that the difference between the maximum value and the minimum value, i.e., the peak value is detected. Then, a half level, for example, of the peak value is selected as the slice level.

On the other hand, it is possible that an actual circuit pattern is formed in a region close to the prealignment mark shown in the upper part A of FIG. 5. Further, placement of the wafer at the TV prealignment station relies upon the mechanical accuracies of the wafer conveying system and, therefore, it is not always possible to assure that only the alignment mark is positioned within the view field of the image pickup tube. As the result, the actual circuit pattern may be detected as if it is the alignment pattern or the bias component may be detected as if it is provided by the alignment pattern, even though no alignment pattern is present within the view field of the image pickup tube.

It is accordingly necessary to discriminate whether or not the detected signal really corresponds to the alignment mark. For this purpose, where the alignment mark such as shown in the upper part A of FIG. 5 is used, whether or not the width of "1" level portion of the binary-coded pattern which is provided by binary-coding the detected integrated-density distribution with a particular slice level, i.e. the value of MR−ML, matches the actual mark width PM in the upper part A of FIG. 5. Depending on the results of such discrimination, whether or not the detected signal really corresponds to the alignment mark is discriminated. This will be called "matching operation".

Figure 6:
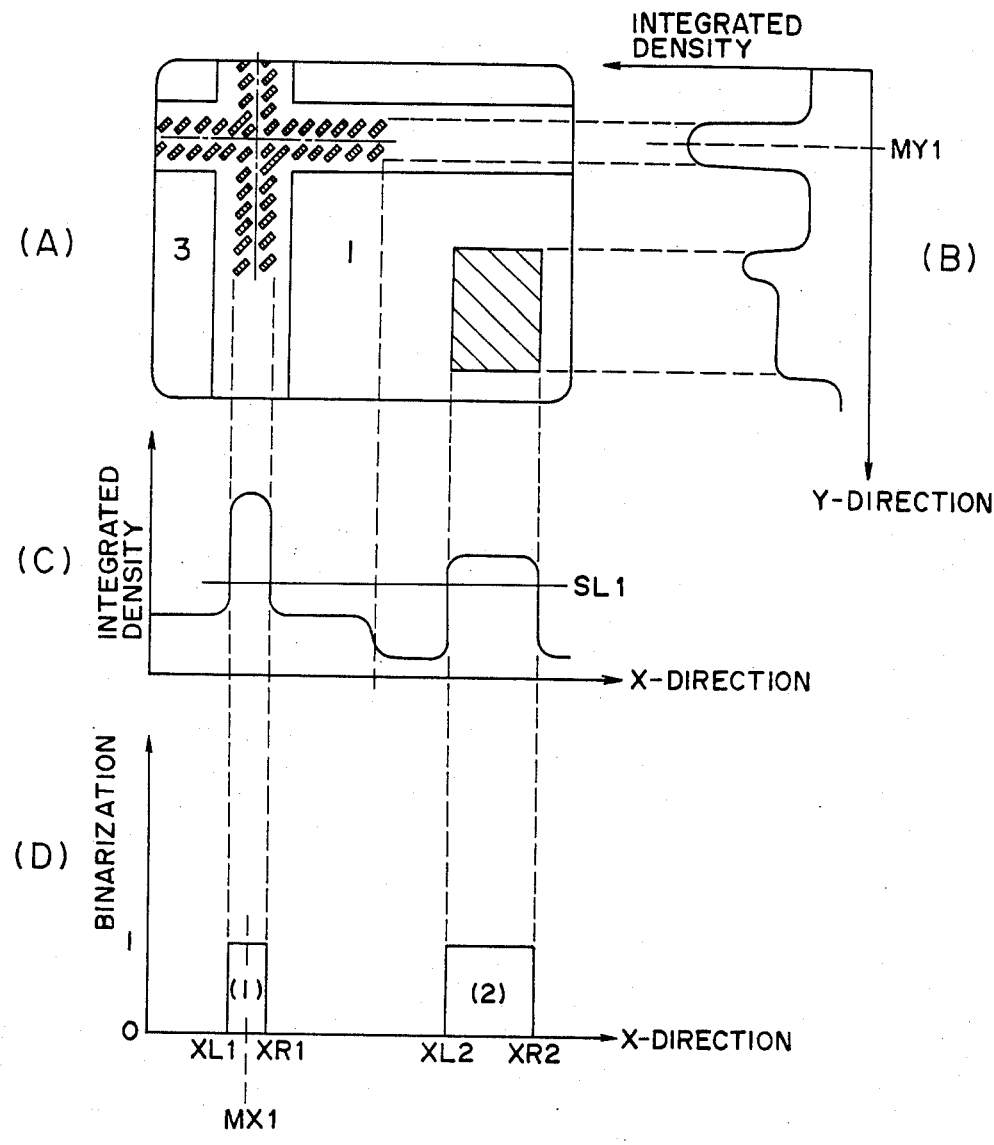
FIG. 6 is a view similar to FIG. 5 but, in this Figure, an actual circuit pattern as well as the TV prealignment mark are present in the field of detection.

The matching operation will now be described in more detail with reference to FIG. 6. If any actual element pattern as well as the alignment mark are within the view field of the image pickup tube, such as shown in a part A of FIG. 6, the integrated densities with reference to the X-direction and Y-direction will have such distributions as shown in parts B and C of FIG. 6, respectively. When the integrated-density distribution in the X-direction is binary-coded with a given slice level SL1, a binary-coded pattern such as shown in a part D of FIG. 6 is obtained. The binary-coded pattern includes two rectangular pulses, i.e. pulses (1) and (2), of "1" level. Thus, the difference between the actual mark width PM (see FIG. 5) and the width of the pulse (1) and the difference between the actual mark width PM and the width of the pulse (2), i.e., (XR1−XL1)−PM; and (XR2−XL2)−PM are calculated. Since a pulse having a width less different from the actual mark width has a higher possibility that it corresponds to the alignment mark, whether or not the width of such pulse, i.e the width of the pulse (1) in this case, is within a predetermined range is discriminated. If within the range, the pulse (1) is discriminated as representing the alignment mark. Accordingly, in the part D of FIG. 6, the position MX1 can be discriminated as being the position of the center of the alignment mark with respect to the X-direction. Similarly, the position MY1 in the part B of FIG. 6 can be discriminatd as being the position of the center of the alignment mark with reference to the Y-direction.

Figure 7:
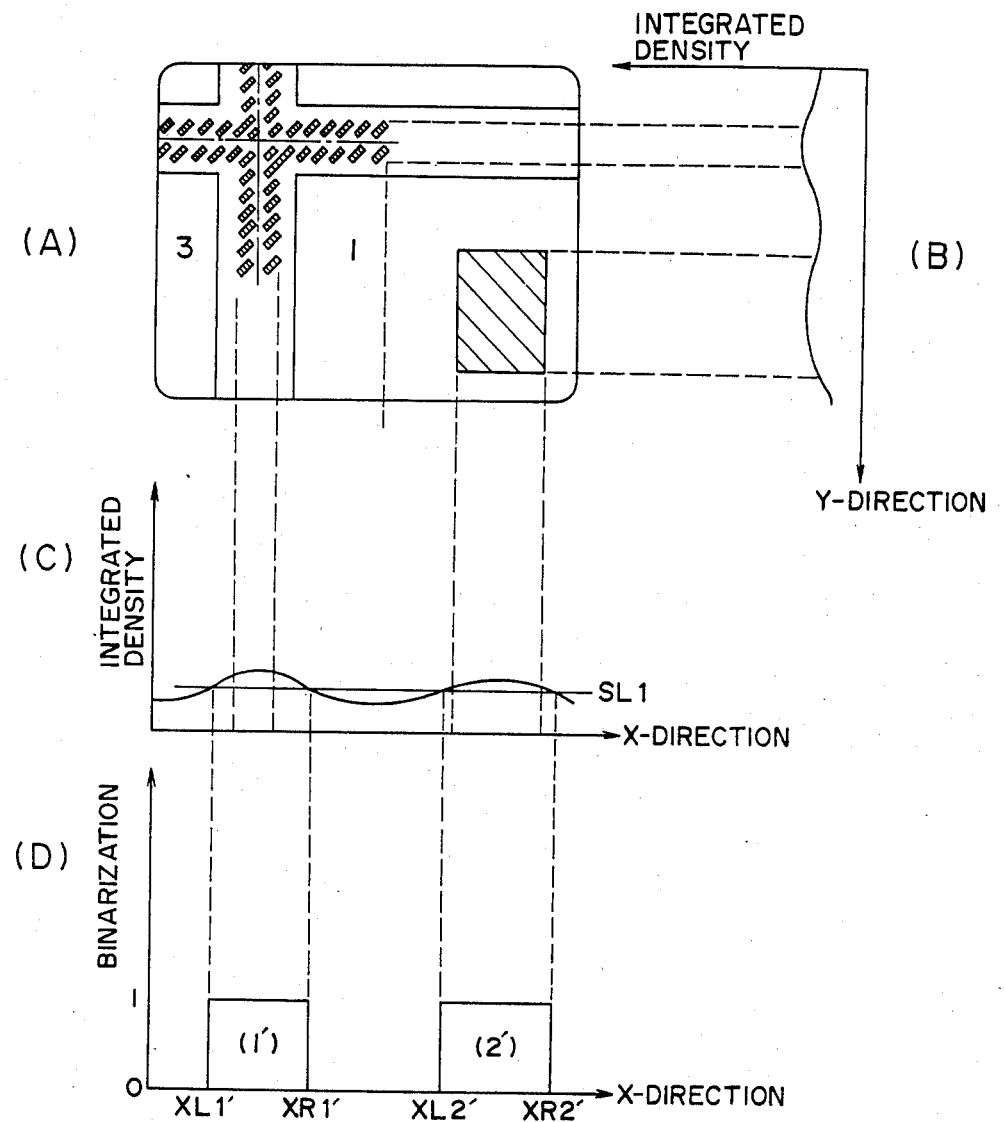
FIG. 7 is a view similar to FIG. 6 but, in a case where the signal-to-noise (S/N) ratio is lower.

During actual alignment and exposure steps, however, wafers of different kinds or conditions are used. Further, the sharpness of the edge of each alignment mark is not always assured. As the result, a superior signal-to-noise ratio is not always attainable so that, depending on the kind or condition of the wafer used or depending on the sharpness of the edge of the alignment mark, undistinguishable distributions such as shown in the parts B and C may be detected with respect to the same alignment mark and actual element pattern as of the part A of FIG. 6. This is not a rare case. The binary-coding relative to the distribution in the X-direction, for example, results in a binary-coded pattern such as shown in the part D of FIG. 7. In such case, using only the matching operation with reference to the actual mark width PM would be insufficient to assure highly accurate position detection. In some cases, a pattern other than the alignment mark, e.g. the actual element pattern or any foreign particles, may be detected as if it is the alignment mark to be detected. Even if no alignment mark is present within the view field of the image pickup tube, it is possible that, depending on the slice level selected, a bias component is sliced to produce a binary-coded pulse accidentally having a width substantially the same as the actual mark width. This leads to erroneous detection.

Figure 8:
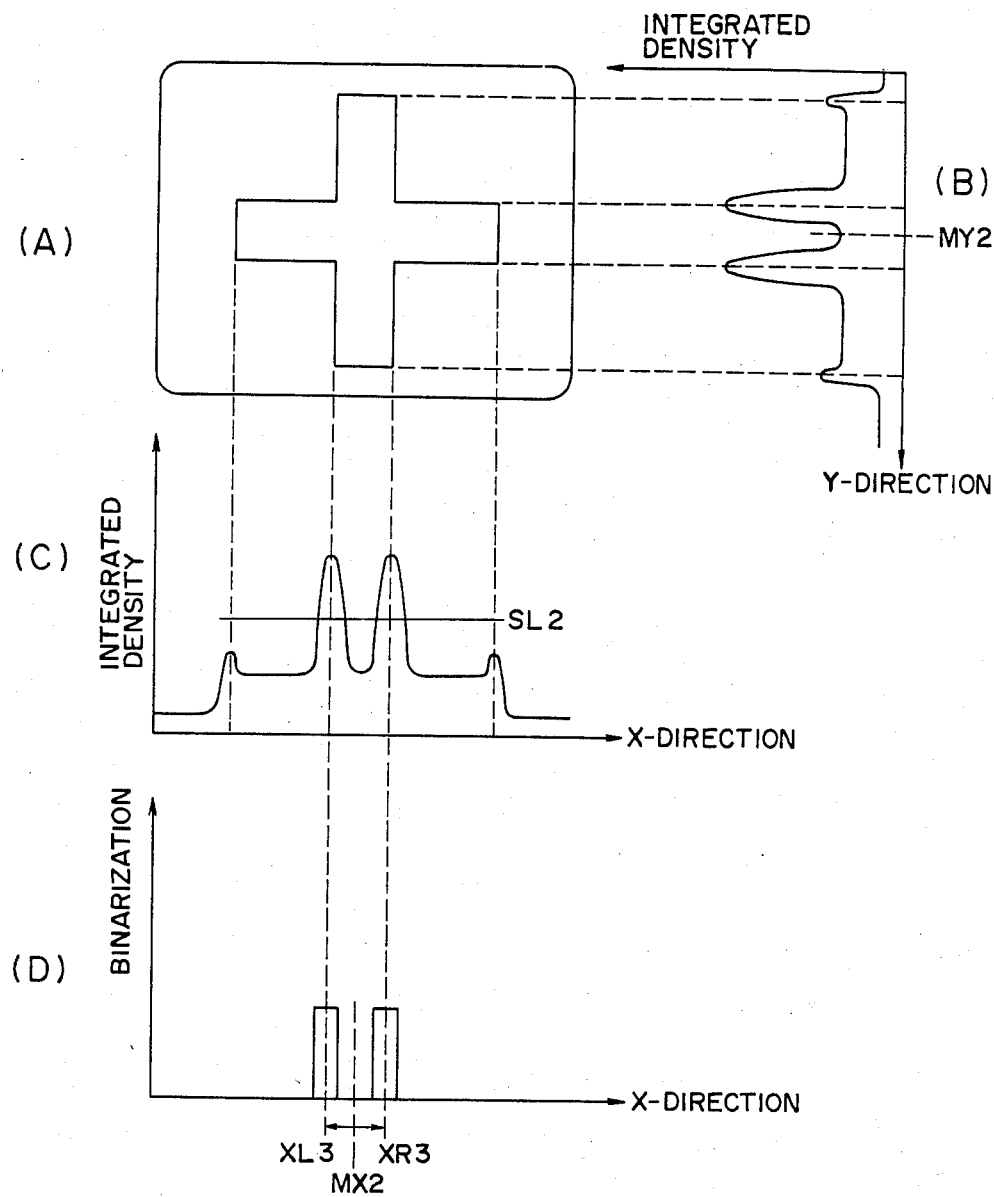
FIG. 8 shows image pickup of a TV pre-alignment mark and signal processing with respect to image density, in accordance with an embodiment of the presen invention.

Such inconveniences are removed by the position detection device and method according to an embodiment of the present invention which will now be described with reference to FIGS. 8 and 9. In summary, the present invention aims at achieving correct and accurate detection of the position of the alignment mark, regardless of the kind or condition of the wafer. For this purpose, the present invention uses an alignment mark adapted to provide plural peaks in the integrated-density distribution. An example of such alignment mark used with the present invention is illustrated in an upper part A of FIG. 8. As shown in this Figure, the alignment mark has the shape of a cross defined by an integral cavity or recess or alternatively defined by an integral protrusion, as compared with the alignment mark shown in FIG. 5. When the alignment mark of this embodiment is illuminated, only the edge portions provide high-luminance reflection. As the result, the density integration with respect to the X-direction and Y-direction provides density distributions such as shown in the parts B and C of FIG. 8, respectively. Clearly, each density distribution has two significant or distinctive peaks corresponding to the alignment mark. When the density distribution in the X-direction shown in the part C of FIG. 8 is binary-coded with an appropriate slice level SL2, a binary-coded pattern such as shown in the part D of FIG. 8 is obtained. It is seen that the mark width in the X-direction is given by the interval between the centers of two rectangular pulses, i.e. the interval XR3−XL3, as shown in the part D of FIG. 8. From this, it follows that the center of the prealignment mark in the X-direction is given by: $MX2=(XR3+XL3)2$. Similarly, the center MY2 in the Y-direction is detected.

Figure 9:
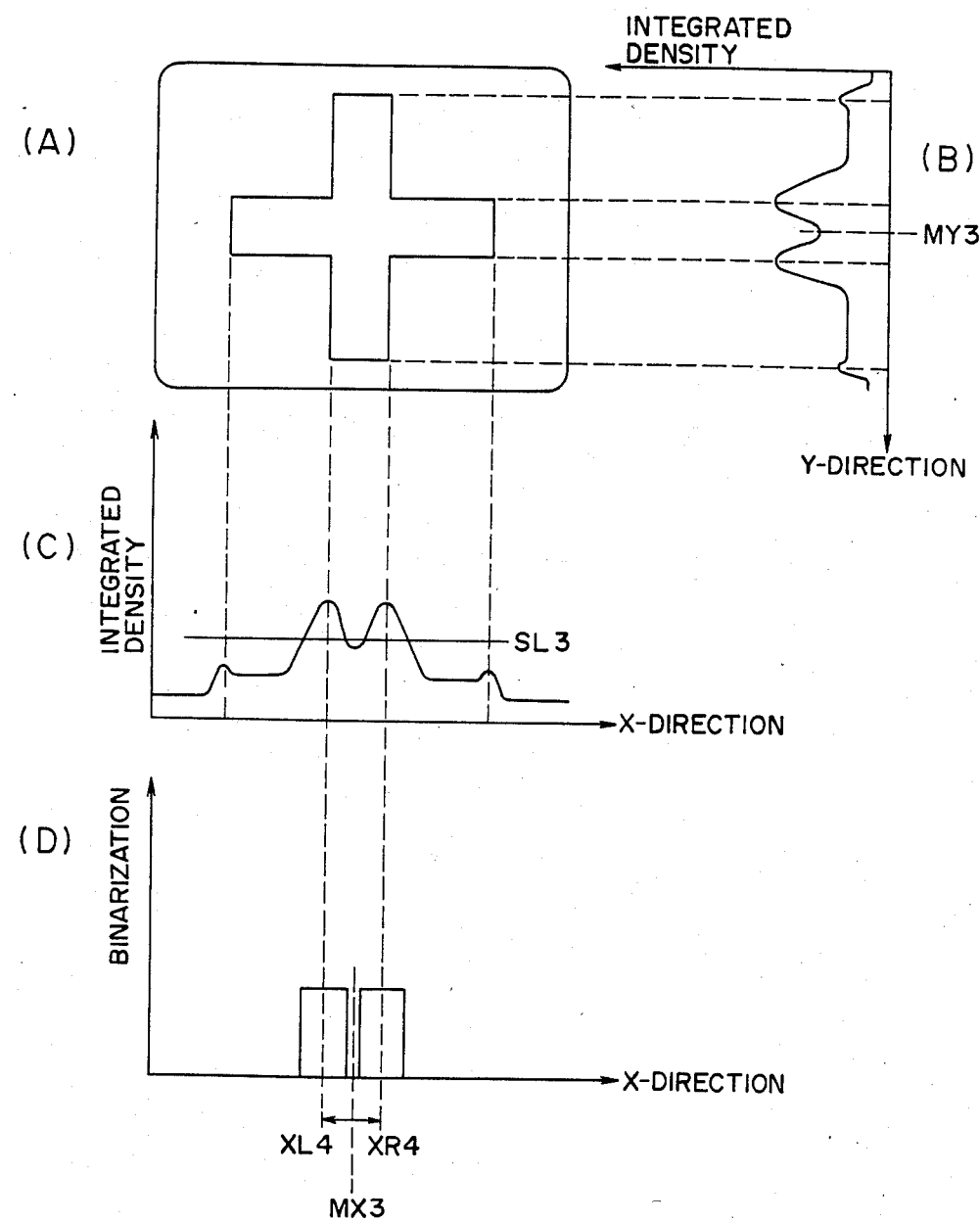
FIG. 9 is a view similar to FIG. 8 but in a case where the signal-to-noise ratio is lower.

It is now assumed that, due to the kind or condition of the wafer or due to the sharpness of the edge of the alignment mark, the video signal obtained from the image pickup tube has a poor gain as compared with the FIG. 8 case so that the density distributions as shown in the parts B and C of FIG. 9 are produced. Although binary-coding the density distribution in the X-direction with a slice level SL3 shows a binary-coded pattern such as shown in the part D of FIG. 9, the mark width can be detected accurately because it is given by the interval between the centers of two rectangular pulses of the binary-coded pattern, i.e. the interval XY4−XL4. It will be understood that there is no significant difference between the interval XR4−XL4 and the interval XR3−XL3 in FIG. 8.

Accordingly, a substantially constant value is obtainable as the width of the alignment mark, independently from the kind or condition of the wafer or the sharpness of the edge of the alignment mark. This allows easy discrimination of the alignment mark from any other pattern, as the result of which the coordinats MX3 and MY3 of the center of the alignment mark with respect to the X-direction and Y-direction are easily detected.

The detection of the width of the prealignment mark on the basis of the detection of the interval between the centers of two rectangular pulses of the binary-coded pattern, as described above, also allows a relatively wide range for a permissible slice level for the binary-coding, since slight variation in the slice level would not cause a significant change in the interval between the pulses that adversely affects the subsequent matching operation. As the result, the slice level can be determined promptly.

Another aspect of the present invention will now be described. In this aspect, the present invention aims at achieving appropriate determination of an optimum slice level in relation to the detection of the position of the alignment mark such as shown in FIG. 8.

For a better understanding of the present invention, the inconveniences involved in the determination of slice level according to a known method will first be described. In accordance with the known method, a given slice level is initially selected to binary-code the data on the integrated density of the detected pattern to obtain binary codes "0" and "1". Subsequently, the number of signals of level "1" (the "1" level portions in the binary-coded pattern) is compared with a reference number. Where the alignment mark such as shown in FIG. 8 is used, the reference number is "two" as will be apparent from the part D of FIG. 8.

Figure 10A:
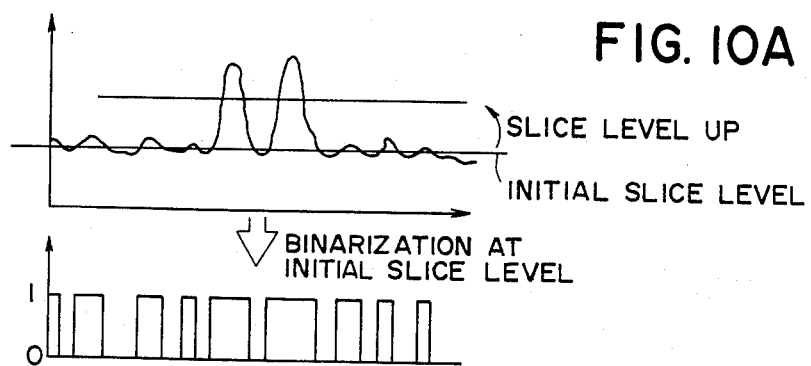
FIGS. 10A–10C illustrate determination of a slice level for binary-coding the integrated image-density distribution.

(1) If the result of comparison shows that the counted number is higher than the reference number, it is discriminated that the initial slice level is too low so that any bias component is sliced. Accordingly, the slice level is increased to execute again the binary-coding (see FIG. 10A).

(2) If, on the other hand, the result of comparison shows that the counted number is lower than the reference number, it is discriminated that the initial slice level is too high so that all the peaks corresponding to the alignment mark are not sliced. Accordingly, the slice level is lowered to execute again the binary-coding (see FIG. 10B).

Figure 10B:
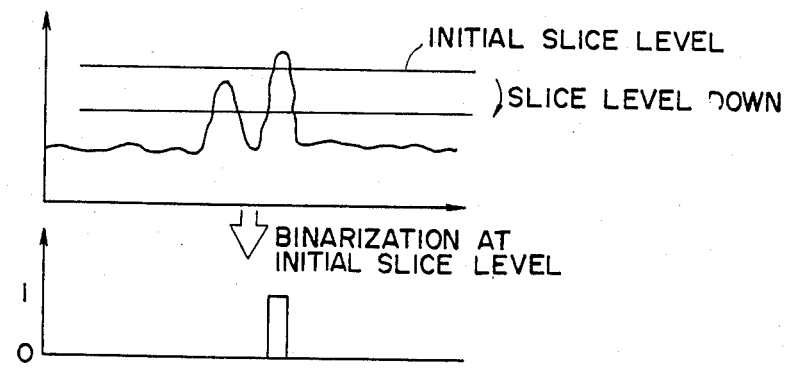
Figure 10C:
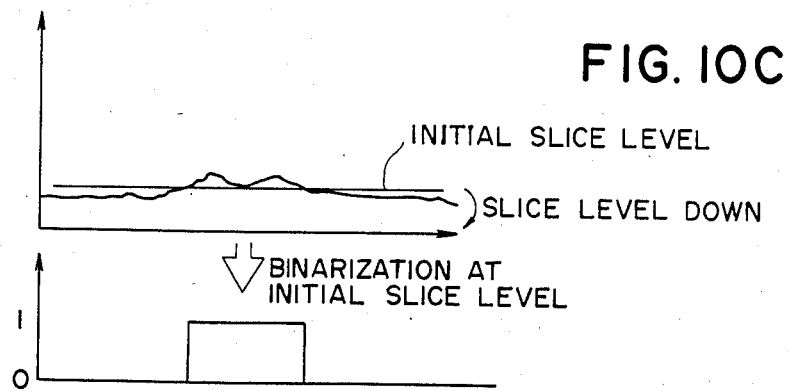

Such method however involves inconveniences. That is, where the signal-to-noise ratio of the video signal is small such as shown in FIG. 10C, the initialy set slice level would have a value close to the bias level. As the result, binary-coding with such initial slice level would produce only one signal of "1" level. If, in such case, an effort is made to determine an appropriate slice level in compliance with the sequence of the binary-coding operation according to the above-described known method, the direction of changing the initial slice level to search or uncover an appropriate slice level would be erroneous, because the number "one" of the "1" level signal commands decrease in the slice level, as will be apparent from FIG. 10C.

Figure 11:
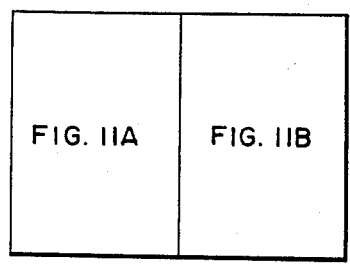
FIGS. 11–11B are flow charts showing the position detecting operation in accordance with an embodiment of the present invention.
Figure 11B:
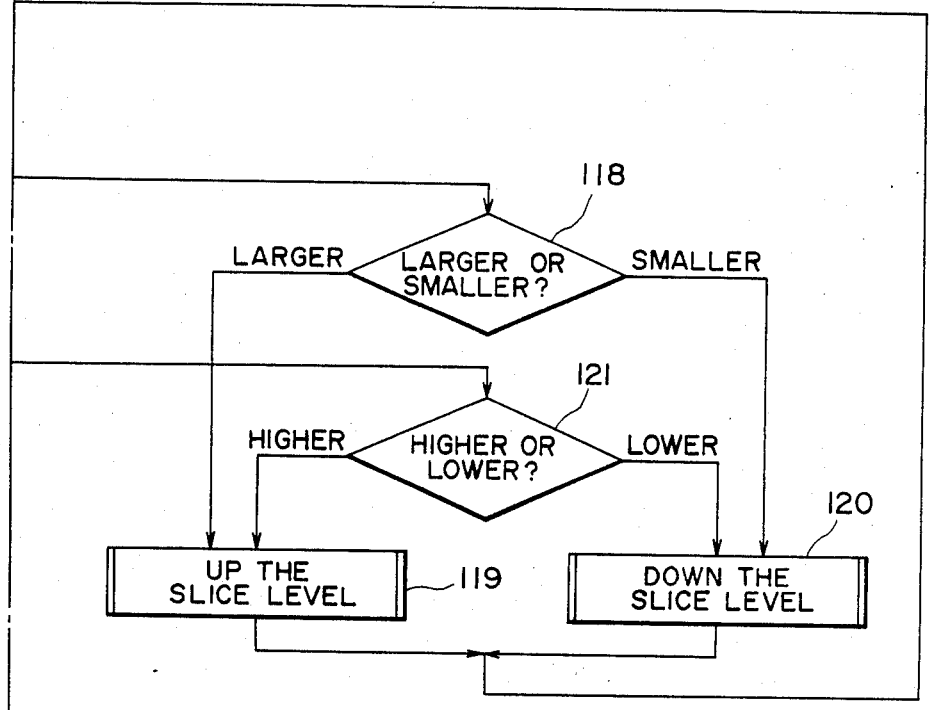

In view of this, according to the present invention, examination of the binary-coded data for the purpose of position detection is made not only in the point of the number of the "1" level signals but also in the point of the sum of the widths of the "1" level signals. Details of the present invention in this aspect will now be described with reference to the flow chart of FIG. 11.

When at Step 111 the microprocessor produces an adding start instruction signal, the adding operation relative to the video signal in each of the X-direction and the Y-direction is initiated. At step 112, the microprocessor stands by until the adding operation is completed. When the adding operation relative to a predetermined number of frames is completed, the sequence proceeds to Step 113. At this Step 113, the microprocessor searches the maximum value and the minimum value of the image density data stored in the adding or integration memory. On the basis of these maximum and minimum values as detected, the aforementioned peak value is determined (Step 113) and a value which is a half of the peak value, for example, is selected as the initial slice level (Step 114).

At the subsequent step, Step 115, the magnitude of each of the data stored in the adding memory is compared with the set slice level, sequentially. If the slice level is greater, a code "0" is formed while, if not so, a code "1" is formed.

If, at this time, the sequence complies with the above-described known method, the number of the "1" level signals is counted and compared with a predetermined reference number, such as shown at Step 117 of the sequence of the present invention. That is, if the counted number is not equal to the reference number, a second slice level is determined in accordance with the counted number in order to execute again the binary-coding. However, this is not preferable because, as has described in the foregoing, correct detection is not attainable where the signal-to-noise level is low such as shown in FIG. 10C.

In accordance with the present invention, prior to effecting such step, the sum of the widths of the "1" level signals is checked at step 116. More specifically, the sum of the widths of the "1" level signals is compared with a predetermined permissible reference value or range which is, for example, a range of ±1% of the actual mark width. In the case of FIG. 10C, according to such processing, the sum of the widths of the "1" level signals, i.e. the total width of the single "1" level signal, is out of the predetermined permissible range. Therefore, Step 118 follows the Step 116 and the total width is detected as being larger than the reference range. Thus, the sequence proceeds to Step 119 whereat a higher slice level is appropriately determined. Also in the case of FIG. 10A, the sum of the widths of the "1" level signals is larger than the permissible reference range. Similarly, the sequence proceeds to Step 119 whereat the slice level is increased appropriately. In the case of FIG. 10B, on the other hand, the total width of the single "1" level signal is smaller than the permissible reference range, so the sequence proceeds to Step 120 whereat a lower slice level is appropriately determined.

As described above, by detecting the sum of the widths of the "1" level signals, in place of the number of such signals, the direction of changing the slice level to search or uncover a suitable slice level can be appropriately determined. Consequently, the time required for resuming the binary-coding at Step 115 can be reduced.

When an appropriate slice level is determined so that the sum of the widths of the "1" level signals comes within the permissible reference range, the sequence proceeds to Step 117 whereat the number of the "1" level signals is checked or compared with a predetermined number. If, at Step 117, the counted number is not equal to the reference number, the sequence proceeds to Step 121 whereat whether the counted number of the "1" level signals is higher or lower than the reference number is discriminated. If higher, the sequence proceeds to Step 119 whereat a higher slice level is appropriately determined while, if lower, the sequence proceeds to Step 120 whereat a lower slice level is appropriately determined.

Where the results of discrimination at Step 117 as well as at Step 116 show that the slice level is proper in respective points, the interval between the signals as designated, for example, by XR3−XL3 in FIG. 8 with respect to the X-direction is subsequently measured and whether or not the detected interval matches the actual mark width is discriminated (Step 122). If the detected pattern is discriminated as being the alignment mark to be detected, the sequence proceeds to Step 123 and to Step 124, whereby the position of the center of the alignment mark is detected. If, on the other hand, the result of comparison at Step 122 shows failure of matching, the detected pattern is discriminated as being something other than the alignment mark, so the sequence proceeds to Step 125. The Step 125 indicates that no alignment mark is present in the view field of the image pickup tube, so that an aligment mark uncovering operation is initiated.

The foregoing process is executed with respect to each of the X-direction and the Y-direction. By this, whether or not the detected pattern is the alignment mark to be detected is correctly and promptly discriminated. As the result, the co-ordinates of the position of the center of the alignment mark can be detected correctly and accurately.

While in the preceding embodiment the examination of the sum of the widths of the "1" level signals is executed prior to the examination of the number of such signals, this order may be reversed. In such case, the system may be arranged so that the examination of the sum of the widths of the "1" level signals is effected only when the number of such signals is lower than the predetermined reference number.

In accordance with the present invention, as has hitherto been described, there is provided a position detecting device and method by which high-accuracy and high-speed detection of the co-ordinates of a mark is assured, with the use of two-dimensional image data and with the use of such mark providing plural peaks in the integrated-density discribution, irrespective of the kind or condition of an object having the mark or irrespective of the sharpness of the edge defining the mark.

Further, according to the present invention, correct discrimination and detection of the mark are attainable even if any other pattern such as an actual element pattern, as well as the mark to be detected, are present in the field of detection. Moreover, stable and high-accuracy detection of the mark is assured even if a good signal-to-noise ratio of the video signal is not obtainable.

While the invention has been described with reference to the structures disclosed herein, it is not confined to the details set forth and this application is intended to cover such modifications or changes as may come within the purposes of the improvements or the scope of the following claims.

What is claimed is:

1. A device for detecting a mark having edges, said device comprising:
    image pickup means for picking up an image of the mark and producing an image signal corresponding thereto;
    extracting means having an extracting level for extracting a component from the image signal, each extracted component having a predetermined relation to the extracting level; and
    control means for controlling the extracting level in accordance with the width and the number of the signal components extracted, so as to obtain signals corresponding to the edges of the mark.

2. A device according to claim 1, wherein said image pickup means includes an area sensor having plural picture elements and signal forming means adapted to accumulate the outputs of said picture elements in a predetermined direction to thereby form the image signal.

3. A device according to claim 1, wherein said extracting means is arranged for binary-coding the image signal with respect to the extracting level to thereby extract the signal component.

4. A device according to claim 1, wherein said control means is arranged first to temporally determine the extracting level in accordance with a total width of the signal component extracted, and then to determine the extracting level in accordance with the number of the extracted signal components.

5. A method for detecting a mark having edges, the method comprising the steps of:
    picking up an image of the mark and producing an image signal corresponding thereto;
    extracting a component from the image signal, each extracted component having a predetermined relation with an extracting level; and
    controlling the extracting level in a first operation so that a signal component substantially of a predetermined width is obtained as a result of extraction with the controlled extracting level, and then controlling the extracting level in a second operation so that a predetermined number of signal components is obtained as a result of extraction with the controlled extracting level, such that signals corresponding to the edges of the mark are obtained by the extraction.

6. A method according to claim 5, further comprising the step of detecting a position of the mark on the basis of the signals corresponding to the edges of the mark, when a signal component of substantially the predetermined width and of the predetermined number is obtained.

* * * * *

UNITED STATES PATENT AND TRADEMARK OFFICE
CERTIFICATE OF CORRECTION

PATENT NO. : 4,688,088  
DATED : August 18, 1987  
INVENTOR(S) : BUNEI HAMAZAKI, ET AL.

Page 1 of 2

It is certified that error appears in the above-identified patent and that said Letters Patent is hereby corrected as shown below:

COLUMN 2

Line 18,   "pre-alignment" should read --prealignment--.  
    Line 20,   "presen" should read --present--.

COLUMN 3

Line 35,   "i.e. a" should read --i.e., a--.  
    Line 65,   "given to" should read --given as to--.

COLUMN 4

Line 38,   "pre-alignment" should read --prealignment--.  
    Line 55,   "avaraged" should read --averaged--.

COLUMN 5

Line 63,   "sysnchronizing" should read --synchronizing--.  
    Line 67,   "Aslo" should read --Also--.

COLUMN 8

Line 9,   "In the" should read --In a--.

COLUMN 9

Line 63,   "i.e." should read --i.e.,--.

COLUMN 10

Line 21,   "coordinats" should read --coordinates--.  
    Line 66,   "initialy" should read --initially--.

UNITED STATES PATENT AND TRADEMARK OFFICE
CERTIFICATE OF CORRECTION

PATENT NO. : 4,688,088

DATED : August 18, 1987

INVENTOR(S) : BUNEI HAMAZAKI, ET AL.

It is certified that error appears in the above-identified patent and that said Letters Patent is hereby corrected as shown below:

COLUMN 11

Line 45, "has" should read --was--.

COLUMN 12

Line 62, "discribution" should read --distribution--.

Signed and Sealed this

Second Day of February, 1988

Attest:

DONALD J. QUIGG

*Attesting Officer*     *Commissioner of Patents and Trademarks*